United States Patent
Ali et al.

(10) Patent No.: US 9,813,030 B1
(45) Date of Patent: Nov. 7, 2017

(54) WIDEBAND SINGLE-ENDED $IM_3$ DISTORTION NULLING

(71) Applicants: Wais M. Ali, Irvine, CA (US); Lloyd F. Linder, Agoura Hills, CA (US)

(72) Inventors: Wais M. Ali, Irvine, CA (US); Lloyd F. Linder, Agoura Hills, CA (US)

( * ) Notice: Subject to any disclaimer, the term of this patent is extended or adjusted under 35 U.S.C. 154(b) by 0 days.

(21) Appl. No.: 15/201,206

(22) Filed: Jul. 1, 2016

(51) Int. Cl.
  *H03F 1/22* (2006.01)
  *H03F 1/32* (2006.01)
  *H03F 3/195* (2006.01)
  *H03F 1/26* (2006.01)

(52) U.S. Cl.
  CPC ............. *H03F 1/3205* (2013.01); *H03F 1/26* (2013.01); *H03F 3/195* (2013.01); *H03F 2200/411* (2013.01); *H03F 2200/451* (2013.01); *H03F 2201/3212* (2013.01)

(58) Field of Classification Search
  CPC ........................................................ H03F 1/22
  USPC ................................................... 330/311, 290
  See application file for complete search history.

(56) References Cited

U.S. PATENT DOCUMENTS

| | | | |
|---|---|---|---|
| 7,154,340 B2* | 12/2006 | Joodaki | H03F 1/22 330/288 |
| 7,362,183 B2* | 4/2008 | Kim | H03F 1/223 330/295 |
| 2008/0042742 A1 | 2/2008 | Linder et al. | |
| 2009/0174481 A1* | 7/2009 | Chang | H03F 1/223 330/277 |

OTHER PUBLICATIONS

Otaka et al, "A + 10dBm IIP3 SiGe Mixer with IM3 Cancellation Technique", ISSCC 2004, Session 21, RF Potpourri, 21.11, 0-7803-8267-6/04; 10 pages.

* cited by examiner

*Primary Examiner* — Henry Choe
(74) *Attorney, Agent, or Firm* — Loza & Loza, LLP; Razmig H. Messerian

(57) ABSTRACT

System-on-chip (SOC) products using high frequency, wideband, highly linear, CMOS and BiCMOS processes will be the next evolution of wireless and wireline communications integrated circuits. Aspects described herein can provide enhanced overall performance over existing prior art single-ended, wideband RF amplifier topologies. A single-ended third order intermodulation distortion nulling circuit can extend the dynamic range for wideband amplifiers up to an order-of-magnitude, without a DC power or noise figure (NF) penalty. The application of distortion nulling can be extended to all the building blocks used in CMOS/BiCMOS RF transceivers to improve performance. The application of this concept to all of the building blocks in an RF transceiver will allow the dynamic range of the transceiver to be increased without suffering a DC power dissipation increase or a significant noise increase.

20 Claims, 11 Drawing Sheets

|  | No Correction | PMOS Mirror Correction | Short Delay NMOS Correction |
|---|---|---|---|
| IIP3 | +2.2 dBm at 1.5GHz | +3.05 dBm at 1.5GHz | +6.5 dBm at 1.5GHz |
| DC Power | 4.6 mW | 5.6 mW | 5.4 mW |

*FIG. 10*

WIDEBAND SINGLE-ENDED IM₃ DISTORTION NULLING

BACKGROUND

Field

Various features relate to signal amplifiers, and more specifically, to single-ended high dynamic range amplifiers featuring distortion nulling.

Background

Many modern wireless communication applications require high performance radio frequency (RF) amplifiers that exhibit low noise, low power consumption, and high linearity, among other things. Third order intermodulation ($IM_3$) distortion in such RF amplifiers threatens these high performance characteristics.

$IM_3$ distortion is the result of extra product terms produced when multiple continuous (CW) signals are presented to a linear circuit. When two tone stimulus frequencies $f_1$ and $f_2$ are applied to a linear circuit, the result at the output of the circuit is the fundamental terms $f_1$ and $f_2$ and $2f_1, 2f_2$, $(f_1+f_2)$, $(f_1-f_2)$, $(2f_1-f_2)$, and $(2f_2-f_1)$. The most important $IM_3$ products are located at $(2f_1-f_2)$, and $(2f_2\ f_1)$. These terms are the most important because they are typically closest in frequency to the fundamental tones $f_1$ and $f_2$. A figure of merit for measuring effects of $IM_3$ is referred to as the third order intercept point ($IP_3$). The parameter $IP_3$ is the measure of an amplifier's linearity. The mathematical expression of $IP_3$ is given by $dBc/2+P_n$, where dBc is the relative difference in amplitude between fundamental frequency tone and the $IM_3$ product term. $P_n$ is the fundamental power measured in dBm reference to 50 ohms.

The $IM_3$ product terms degrade the quality of a signal being amplified. In order to improve $IP_3$, $Veff=Vgs-V_t$ of the amplifier's input transistor can be increased by increasing the direct current (DC) power consumption. Since Veff is directly proportional to third order harmonics, an amplifier designer can make the tradeoff of improving $IP_3$ at the expense of increased DC power consumption. This, however, may not be feasible for applications requiring low power.

Another approach is to cancel out $IM_3$ product terms using $IM_3$ correction circuits. Low noise, low power, radio frequency (RF) amplifiers in most communication applications have a single-ended input in order to achieve low noise figure as well as achieve good matching at the antenna interface. In order to achieve $IM_3$ cancellation in a wideband, single-ended amplifier circuit, $IM_3$ correction circuitry must also be wideband, low power, and single-ended.

Single-ended, common gate based correction utilizing mirroring circuitry can be used, and one such example found in the prior art is shown in FIG. 1. However, for wideband high frequency applications p-channel metal oxide semiconductor field effect transistor (PMOS) mirror devices, such as P1 and P2 shown in FIG. 1, are too slow due to mobility µp of PMOS devices being 2.5 to 3 times slower than n-channel metal oxide semiconductor field effect transistor (NMOS) devices' mobility µn. PMOS devices do not provide adequate bandwidth to achieve large reduction in the $IM_3$ products as operating frequencies are increased. Consequently the $IP_3$ performance of the circuit shown in FIG. 1 is inherently limited. Moreover, parasitic capacitance introduced by the mirroring circuitry (e.g., P1 and P2) may add substantial delay unless care is taken to minimize it. This delay will create an undesirable phase shift at the summing node, which will further reduce $IP_3$ performance.

Thus, there is a need for low power, highly linear, low noise RF amplifiers having $IM_3$ distortion nulling that feature great $IP_3$ performance even for wideband and high frequency applications. Such amplifiers should have correction circuitry that does not significantly impact DC power consumption, increase noise, or suffer from significant nonlinearity due to delay like the correction circuitry of the prior art.

SUMMARY

Highly integrated, wideband, system-on-chip (SOC) devices using small geometry complementary metal oxide semiconductor field effect transistor (CMOS) or bipolar junction transistor plus CMOS (BiCMOS) processes will be the next evolution of wireless and wireline communication integrated circuits. In one aspect, the present disclosure generally relates to low power, wideband, single-ended, $IM_3$ nulling for wideband RF amplifier applications. Various aspects disclosed herein provide a simultaneous increase in a receiver's front end dynamic range while reducing the DC power of the front end. This counter-intuitive finding is a result of the novel attributes of aspects of the disclosure described herein.

One feature pertains to an integrated circuit comprising a main amplifier circuit having a single-ended signal input and a single-ended signal output with a signal path existing there between, and a correction circuit coupled to the main amplifier circuit, the correction circuit including an auxiliary transistor having a gate or a base coupled to the single-ended signal input of the main amplifier circuit and a drain or a collector coupled to the signal path to reduce intermodulation products generated by the main amplifier circuit. According to one aspect, the correction circuit includes only one active component, the one active component being the auxiliary transistor. According to another aspect, the auxiliary transistor is a solitary active device of the correction circuit that receives an input signal from the single-ended signal input and provides an intermodulation product cancellation signal to the signal path to reduce the intermodulation products generated by the main amplifier circuit.

According to one aspect, the auxiliary transistor is an n-channel device. According to another aspect, the auxiliary transistor is a p-channel device. According to yet another aspect, the main amplifier circuit includes a first transistor and a second transistor arranged in a two-stage common gate or two-stage common base architecture with the single-ended signal input coupled to a source or an emitter of the first transistor and the single-ended signal output coupled to a drain or a collector of the second transistor, a drain or a collector of the first transistor coupled to a source or an emitter of the second transistor at a common point, and the drain or the collector of the auxiliary transistor coupled to the common point.

According to one aspect, the first, second, and auxiliary transistors are n-channel devices. According to another aspect, the first, second, and auxiliary transistors are p-channel metal oxide semiconductor field effect transistor (PMOS) devices. According to yet another aspect, the main amplifier circuit includes a first transistor and a second transistor arranged in a two-stage common source or a two-stage common emitter architecture, the first transistor receiving the single-ended signal input and the second transistor providing the single-ended signal output, and the drain or the collector of the auxiliary transistor coupled to a common point of the main amplifier circuit where the first and second transistors are coupled to each other.

According to one aspect, the main amplifier circuit includes a first transistor and a second transistor arranged in a two-stage common drain or a two-stage common collector architecture, the first transistor receiving the single-ended signal input and the second transistor providing the single-ended signal output, and the drain or the collector of the auxiliary transistor coupled to a common point of the main amplifier circuit where the first and second transistors are coupled to each other. According to another aspect, the auxiliary transistor has a width and a length that is sized relative to a width and a length of an input transistor of the main amplifier circuit such that third order intermodulation products generated by the auxiliary transistor and provided to the signal path have a magnitude that is substantially same as a magnitude of third order intermodulation products generated by the main amplifier circuit. According to yet another aspect, an input signal gain of the correction circuit is between 15 dB to 40 dB less than a signal gain between the single-ended signal input and the single-ended signal output of the main amplifier circuit.

According to one aspect, the correction circuit includes at least one biasing capacitor and a biasing resistor that provide a biasing voltage to the auxiliary transistor. According to another aspect, a capacitance value of the capacitor and a resistance value of the resistor cause the auxiliary transistor to have a gate-source voltage or a base-emitter voltage that is scaled relative to a gate-source voltage or a base-emitter voltage of an input transistor of the main amplifier circuit.

Another feature provides a radio frequency (RF) amplifier comprising a main amplifier circuit having a single-ended signal input and a single-ended signal output, the main amplifier circuit including a signal path between the single-ended signal input and the single-ended signal output, and a correction circuit coupled to the main amplifier circuit, the correction circuit including a solitary auxiliary transistor providing an intermodulation product cancellation signal to the signal path to reduce intermodulation products generated by the main amplifier circuit, the intermodulation product cancellation signal based on an input signal provided to the single-ended signal input. According to one aspect, the auxiliary transistor is an n-channel device. According to another aspect, the main amplifier circuit includes a first transistor and a second transistor arranged in a two-stage common gate or two-stage common base architecture with the single-ended signal input coupled to a source or an emitter of the first transistor and the single-ended signal output coupled to a drain or a collector of the second transistor, a drain or a collector of the first transistor coupled to a source or an emitter of the second transistor at a common point, and the solitary auxiliary transistor providing the intermodulation product cancellation signal to the signal path at the common point. According to yet another aspect, the auxiliary transistor has a width and a length that is sized relative to a width and a length of an input transistor of the main amplifier circuit such that third order intermodulation products generated by the auxiliary transistor and provided to the signal path have a magnitude that is substantially same as a magnitude of third order intermodulation products generated by the main amplifier circuit.

Another feature provides a radio frequency (RF) amplifier comprising a main amplifier circuit including an input transistor having a single-ended input and a second transistor having a single-ended output, the input transistor and the second transistor coupled to each other and arranged in a common gate or a common base architecture, the main amplifier circuit having a signal path through the input transistor and the second transistor that is adapted to amplify an input signal provided to the single-ended input, and a correction circuit coupled to the main amplifier circuit, the correction circuit including a solitary auxiliary transistor having a gate or a base adapted to receive the input signal and a drain or a collector adapted to provide an intermodulation product cancellation signal to the signal path to reduce intermodulation products generated by the main amplifier circuit, the intermodulation product cancellation signal based on the input signal received at the gate or the base of the solitary auxiliary transistor. According to one aspect, a signal gain of the correction circuit is at least 15 dB less than a signal gain between the single-ended input and the single-ended output of the main amplifier circuit.

BRIEF DESCRIPTION OF THE DRAWINGS

FIG. 10 illustrates a table that summarizes and compares the IIP3 performance and DC power consumption of various RF amplifier simulations shown and described with respect to FIGS. 7-9.

DETAILED DESCRIPTION

Figure 1:
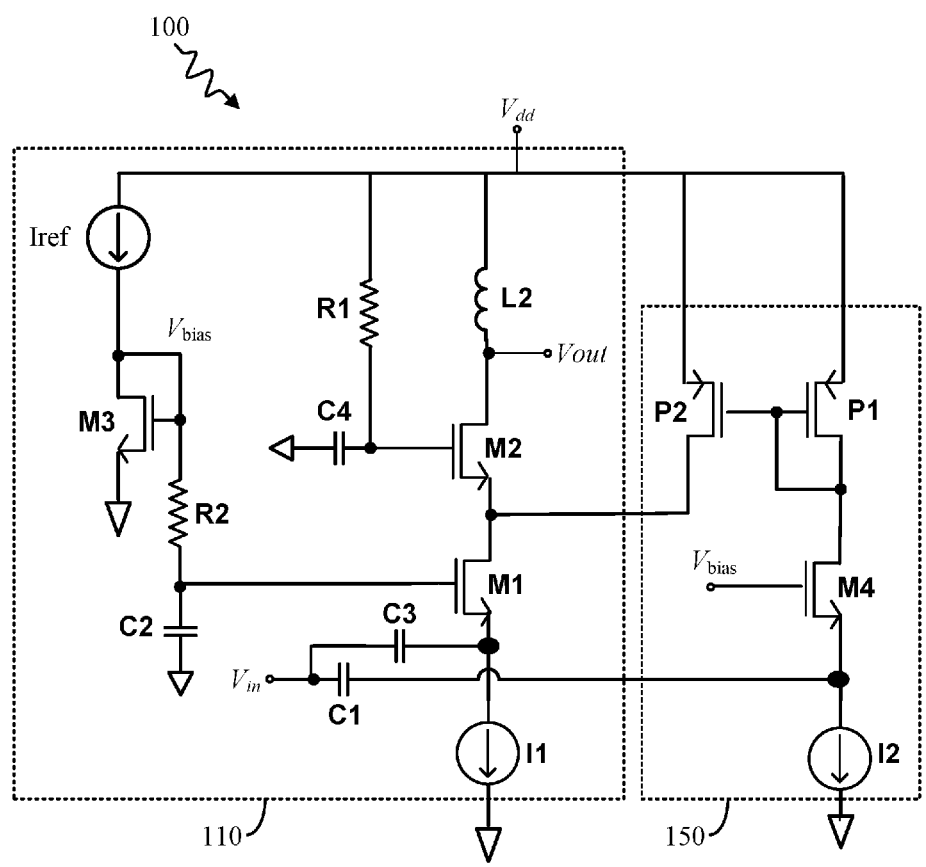
FIG. 1 illustrates a single-ended, common gate based correction circuitry utilizing a PMOS mirror topology found in the prior art.

In the following description and claims, the terms "coupled" and "connected," along with their derivatives, may be used. It should be understood that these terms are not intended as synonyms for each other. Rather, in particular aspects, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An aspect is an implementation or example. Reference in the specification to "an aspect," "one aspect," "some aspects," "various aspects," or "other aspects" means that a particular feature, structure, or characteristic described in connection with the aspects is included in at least some aspects, but not necessarily all aspects, of the present techniques. The various appearances of "an aspect," "one aspect," or "some aspects" are not necessarily all referring to the same aspects. Elements or aspects from an aspect can be combined with elements or aspects of another aspect.

Not all components, features, structures, characteristics, etc. described and illustrated herein need be included in a particular aspect or aspects. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some aspects have been described in reference to particular implementations, other implementations are possible according to some aspects. Additionally, the arrangement and/or order of circuit elements or other features illustrated in the drawings and/or described herein need not be arranged in the particular way illustrated and described. Many other arrangements are possible according to some aspects.

In each figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

Overview

Low noise, low power, RF amplifiers in most communication applications have a single-ended input in order to achieve low noise figure as well as achieve good matching at the antenna interface. In order to achieve $IM_3$ cancellation in a wideband, single-ended amplifier circuit, $IM_3$ correction circuitry should also be wideband, low power as well as single-ended. In order for the correction to be wideband and operate at high RF frequencies n-channel devices may be utilized due to their relatively high mobility compared to p-channel devices. However, p-channel devices may also be used for certain applications assuming the circuit delay through the cancellation circuitry is minimized.

The RF amplifiers described herein include a main amplifier and a correction circuit (e.g., correction section). The correction circuit may also be referred to as an "auxiliary amplifier." The active devices of the auxiliary amplifiers described herein are preferably composed of a single device (e.g., single NMOS, PMOS, or NPN device) that is coupled to a single-ended main amplifier. One critical function of the auxiliary amplifier is to correct the $IM_3$ products produced in the main amplifier. In one aspect, the auxiliary amplifier may be constructed from a single n-channel device (e.g., NMOS or NPN) thereby exhibiting minimal delay so that it provides very high bandwidth capability especially over p-channel based cancellation circuits of the prior art. This is due to the mobility of n-channel devices having a mobility that is 2-3 times faster than the mobility of p-channel devices. In other aspects, the auxiliary amplifier may be constructed from a single p-channel device (e.g., PMOS or PNP) to also minimize delay. Such a configuration may be used if the main amplifier to which it is coupled is composed of p-channel devices.

The auxiliary amplifier provides a scaled down magnitude of the main amplifier's fundamental signal as well as an in-phase $IM_3$ term, and both of these terms are summed at a common point in the main amplifier. At this critical point, the undesired third order terms will cancel, resulting in a reduction of overall $IM_3$. This results in substantial improvement in $IP_3$ over a wide range of frequencies because of the reduced delay inside the auxiliary amplifier. This improvement allows the DC power dissipation of the overall amplifier to be significantly reduced, as the main amplifier distortion is reduced by an order of magnitude as a result of $IM_3$ cancellation.

Various Aspects of RF Amplifier Featuring $IM_3$ Distortion Nulling

Figure 2:
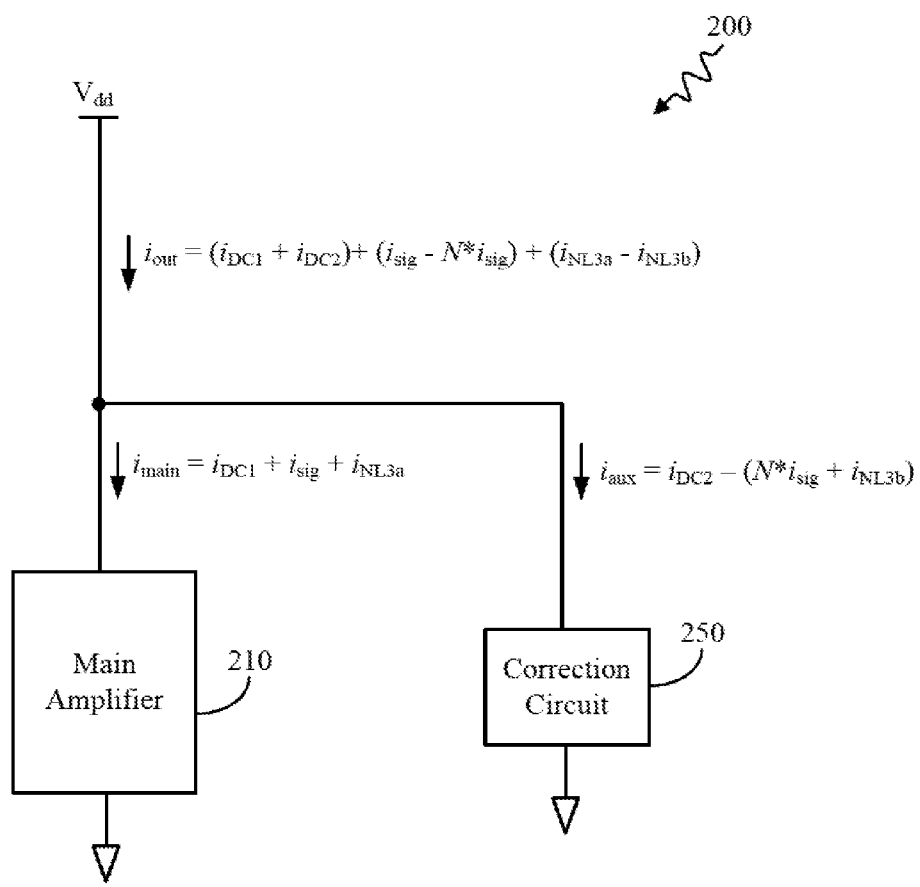
FIG. 2 illustrates a high-level schematic of a wideband RF amplifier featuring IM3 distortion nulling.

FIG. 2 illustrates a high-level schematic of a wideband RF amplifier 200 featuring $IM_3$ distortion nulling according to one aspect. The RF amplifier 200 includes a main amplifier circuit 210 and a correction circuit 250 (e.g., "auxiliary amplifier"). The main amplifier 210 generates a main signal current $i_{main}$ that includes signal component $i_{sig}$, a DC component $i_{DC1}$, and a third order nonlinear current $i_{NL3a}$. The ratio of the third order nonlinear current component $i_{NL3a}$ to the signal current component $i_{sig}$ represents the $IM_3$ performance for the main amplifier 210 alone.

The correction circuit 250 generates an auxiliary signal current $i_{aux}$ that includes a DC component $i_{DC2}$ and a scaled down version of the main amplifier's signal current component $N*i_{sig}$. The auxiliary signal also includes a third order nonlinear current $i_{NL3b}$, which is on the order of the third order nonlinear current $i_{NL3a}$ in the main amplifier 210. Essentially, the correction circuit 250 is a low power version of the main amplifier 210 but the signal gain is deliberately lowered in order to generate a replica of the main amplifier's 210 $IM_3$ with the same magnitude and opposite phase. According to one aspect, the correction circuit 250 has an input signal gain that is at least 5 dB less than the input signal gain (i.e., signal gain between $V_{in}$ and $V_{out}$) of the main amplifier circuit. According to one aspect, the correction circuit 250 has an input signal gain that is at least 10 dB less than the input signal gain of the main amplifier circuit. According to one aspect, the correction circuit 250 has an input signal gain that is at least 15 dB less than the input signal gain of the main amplifier circuit. According to one aspect, the correction circuit 250 has an input signal gain that is at least 15 dB to 40 dB less than the input signal gain of the main amplifier circuit.

The resultant output signal current of the RF amplifier 200 is given by: $i_{out}=i_{main}+i_{aux}$. If the correction circuit 250 is based on n-channel active devices then the correction circuit 250 inverts the phase of the current terms $i_{DC2}$, $N*i_{sig}$, and $i_{NL3b}$ and the output signal current of the RF amplifier 200 is given by $i_{out}=i_{main}+i_{aux}=(i_{DC1}+i_{DC2})+(i_{sig}-N*i_{sig})+(i_{NL3a}-i_{NL3b})$ where N is a scaling factor much less than one (1). Moreover, the $IM_3$ terms also substantially cancel each other out since they are largely the same magnitude and opposite phase. This results in an RF amplifier 200 output $i_{out}$ having reduced $IM_3$ distortion and consequently an improvement in $IP_3$ performance.

Figure 3:
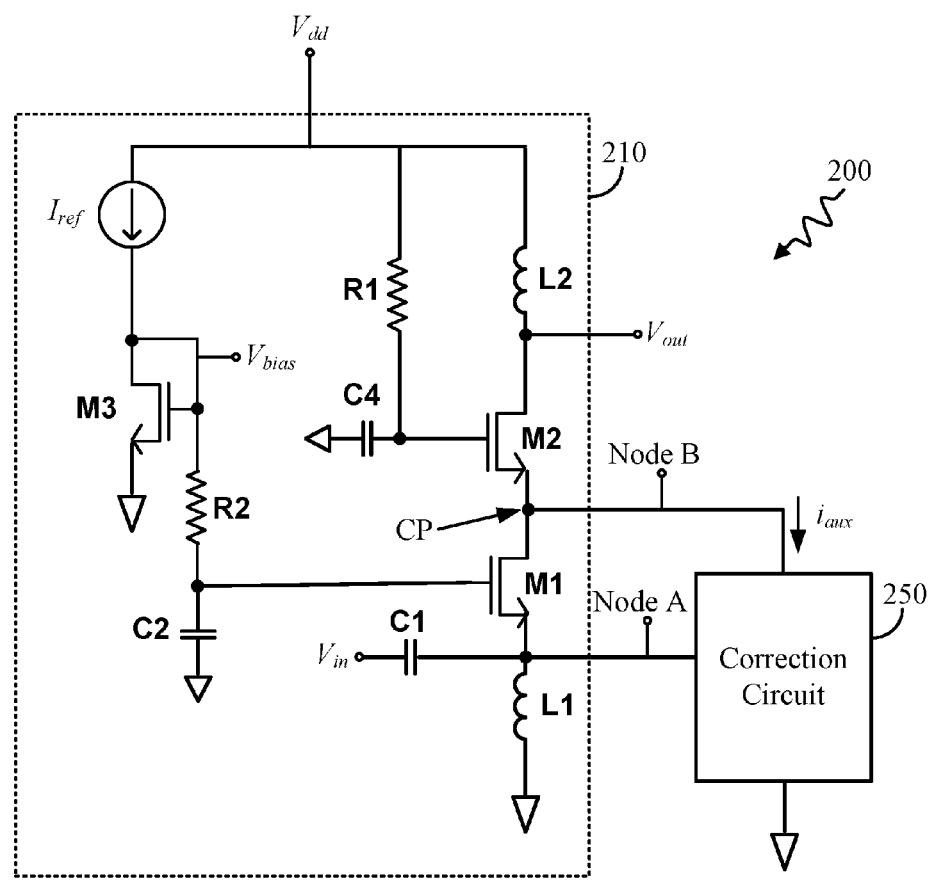
FIG. 3 illustrates a first exemplary novel wideband RF amplifier with correction circuitry.
Figure 4:
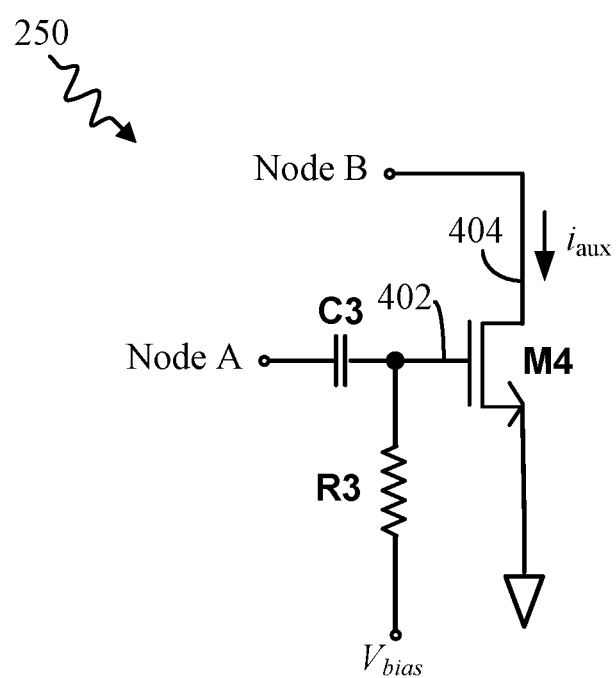
FIG. 4 illustrates a first exemplary schematic of the correction circuit for the RF amplifier shown in FIG. 3.

FIGS. 3 and 4 illustrate a first exemplary novel wideband RF amplifier 200 according to one aspect of the disclosure. The RF amplifier 200 shown in FIGS. 3 and 4 is a CMOS, wideband amplifier having a common gate architecture (e.g., two-stage common gate). The RF amplifier 200 includes the main amplifier 210 and the correction circuit 250. The main amplifier includes a first NMOS transistor M1 (e.g., "input transistor") having a transconductance (gm) that establishes a real 50 ohms impedance at the input node $V_{in}$ given by the equation Rin=1/gm, where Rin is the input real impedance. Passive devices C1 and L1 resonate out the effects of the amplifier's 200 package bondwire inductance as well as parasitic capacitance lumped at the input node $V_{in}$. Active devices M1 and M2 form a first and second common gate stage in the main amplifier 210 and provide isolation between the input node $V_{in}$ and the output node $V_{out}$. Passive devices R1 and C4 form an RC low-pass filter, which rejects undesired common mode, low frequency noise on the power supply $V_{dd}$. The main DC bias voltage $V_{bias}$ is generated by devices C2, R2, and M3. $I_{ref}$ is a DC bias current which will create a gate-source voltage (Vgs) across the gate of NMOS transistor M3. This voltage is mirrored across the gate-source voltage Vgs of the first transistor M1 thereby putting the NMOS transistor M1 in a saturation mode of operation and allowing the wideband main amplifier circuit 210 to amplify a given signal at the input $V_{in}$.

FIG. 4 illustrates a first exemplary schematic of the correction circuit 250 according to one aspect of the disclosure. As previously mentioned, the correction circuit 250 is coupled to the main amplifier 210 and provides an intermodulation product cancellation signal to the main amplifier's signal path to cancel out $IM_3$ distortion products produced by the main amplifier 210. In the example illustrated in FIG. 4, the correction circuit's 250 active components includes a single NMOS transistor M4 (e.g., auxiliary transistor) that has a gate terminal 402 coupled to the input signal $V_{in}$ and a drain terminal 404 coupled to the common point CP ("common node") of the main amplifier's active devices M1 and M2. The correction circuit 250 will produce a scaled down version of the main amplifier circuit's 210 signal current. Specifically, the correction circuit's 250 signal current $N*i_{sig}$ is equal to $gm_{M4}*Vgs_{M4}$, where the transconductance $gm_{M4}=gm_{M1}*N$. The fraction N is equal to $SQRT[(W_{M4}/L_{M4})/(W_{M1}/L_{M1})]$, where W and L refer to the device width and length, respectively.

Passive devices C3 and R3 provide the correction circuit's 250 DC biasing and provide alternating current (ac) coupling between the main amplifier (Node A) and M4's input terminal 402. The Vgs of M4 (i.e., $Vgs_{M4}$) is biased such that it is a scaled version of the main amplifier's first transistor M1 Vgs (i.e., $Vgs_{M1}$). For example, the width $W_4$ of M4 is chosen in order to supply M4 with the appropriate Vgs according to the equation $Vgs_{M4}=SQRT[2i/(\mu C_{ox} (W_{M4}/L_{M4}))] V_t$, where i (e.g., $i_{Aux}$) is the output current of $M_4$, $\mu$ is the carrier mobility, and $C_{ox}$ is the gate-to-channel capacitance per unit area.

The DC and signal currents of the main amplifier 210 and the correction circuit 250 are summed at the common point CP. That is, the signal $i_{Aux}$ provided by the correction circuit 250 is summed at the common point CP so that $i_{Aux}$ is subtracted from the main amplifier's signal path. It is at the common point CP where the $IM_3$ terms (e.g., $i_{NL3a}$ and $i_{NL3b}$) will cancel.

Figure 5:
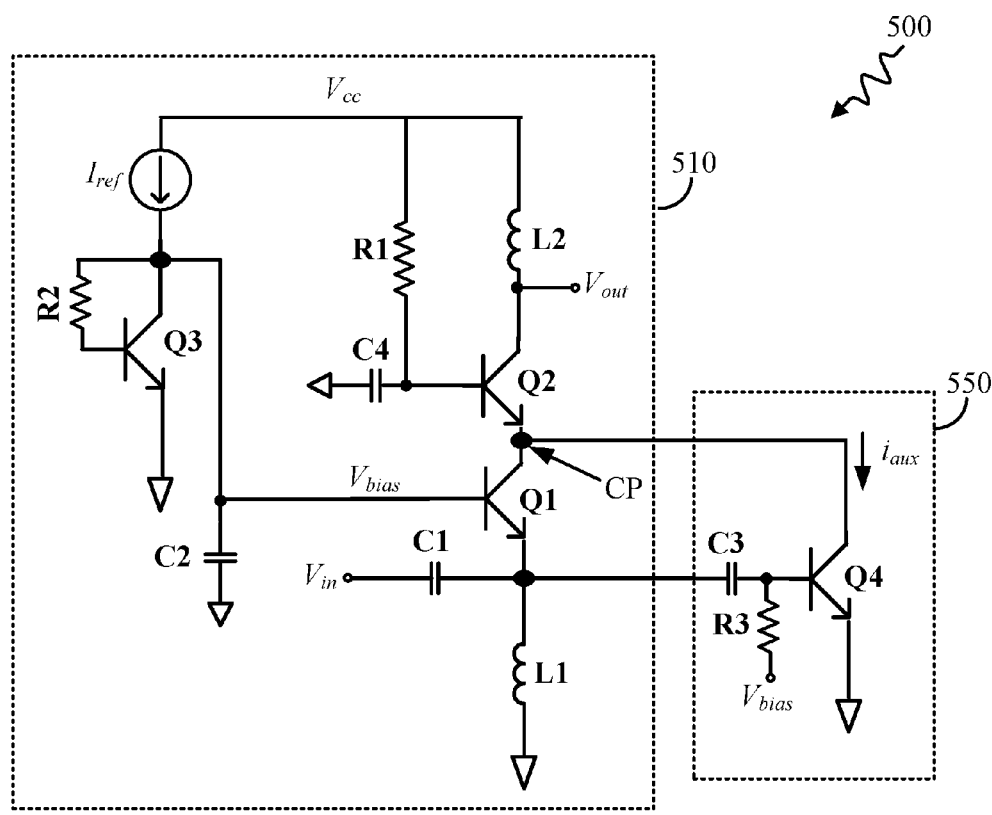
FIG. 5 illustrates a second exemplary novel wideband RF amplifier having correction circuitry.

FIG. 5 illustrates a second exemplary novel wideband RF amplifier 500 according to one aspect of the disclosure. The RF amplifier 500 shown in FIG. 5 is a bipolar transistor-based, wideband amplifier having a common base architecture (e.g., two-stage common base). The RF amplifier 500 includes the main amplifier 510 and the correction circuit 550. Like its CMOS counterpart shown in FIGS. 3 and 4, the bipolar transistor-based design also includes a single transistor for the correction circuit 550, which greatly reduces delay and increases $IP_3$ performance.

The transconductance gm of the NPN transistor Q1 provides the 50 ohm real input impedance needed to interface with outside devices based on the equation Rin=1/gm. Passive devices C1 and L1 resonate out any parasitic inductance seen at the package level and internal gate source parasitic capacitance (Cgs) of device Q1. Active devices Q1 and Q2 provide isolation between $V_{in}$ and $V_{out}$ and form a first and second common gate stage of the main amplifier 510. Passive devices R1 and C4 low-pass filter out any low frequency noise on the supply $V_{cc}$. The main DC bias voltage $V_{bias}$ is generated by devices R2 and Q3. Feedback resistor R2 will compensate for the input transistor's Q1 kickback base current given by $I_{Base}=I_{Collector}/\beta$, where $\beta$ is the current gain parameter. Capacitor C2 low-pass filters any common mode noise that can come from reference current $I_{ref}$.

The cancellation circuit 550 is coupled to the main amplifier 510 and provides an intermodulation product cancellation signal to the main amplifier's signal path to cancel out the $IM_3$ distortion products produced by the main amplifier 510. The cancellation circuit shown in FIG. 5 consists of a single active device, which is an NPN transistor Q4 (e.g., "auxiliary transistor"), that produces a scaled down version of the main amplifier's signal current in addition to the $IM_3$ third order nonlinear current. The DC biasing of the cancellation circuit's transistor Q4 is achieved with passive devices R3 and C3. In some aspects, the resistor R3 may be excluded. The base-emitter voltage $V_{BE}$ of Q4 is equal to $\eta*KT/q*ln(Ic/Is)$, where $\eta$ is the area of the transistor Q4, KT/q is a constant 25 mV built-in voltage and Ic and Is are the collector and saturation currents, respectively. The transistor Q4 is scaled down by making its area smaller than the area of the main amplifier's input transistor Q1. The DC and signal currents of the main amplifier 510 and the correction circuit 550 are summed at the common point CP. That is, the signal $i_{Aux}$ provided by the correction circuit 550 is summed at the common point CP so that $i_{Aux}$ is subtracted from the main amplifier's signal path. It is at the common point CP where the $IM_3$ terms (e.g., $i_{NL3a}$ and $i_{NL3b}$) will cancel.

The single transistor M4/Q4 design of the correction circuit 250 shown in FIGS. 4 and 5 allows the correction circuit 250 to provide a signal to the main amplifier signal path that cancels the $IM_3$ distortion products with very little delay. Less delay means less phase and less non-linearity, and consequently greater $IM_3$ product cancelation. The n-channel design also allows the RF amplifier 200 to operate at relatively high frequencies and thus the cancellation circuit 250 allows the RF amplifier 200 to operate effectively across a wide band of frequencies.

Figure 6:
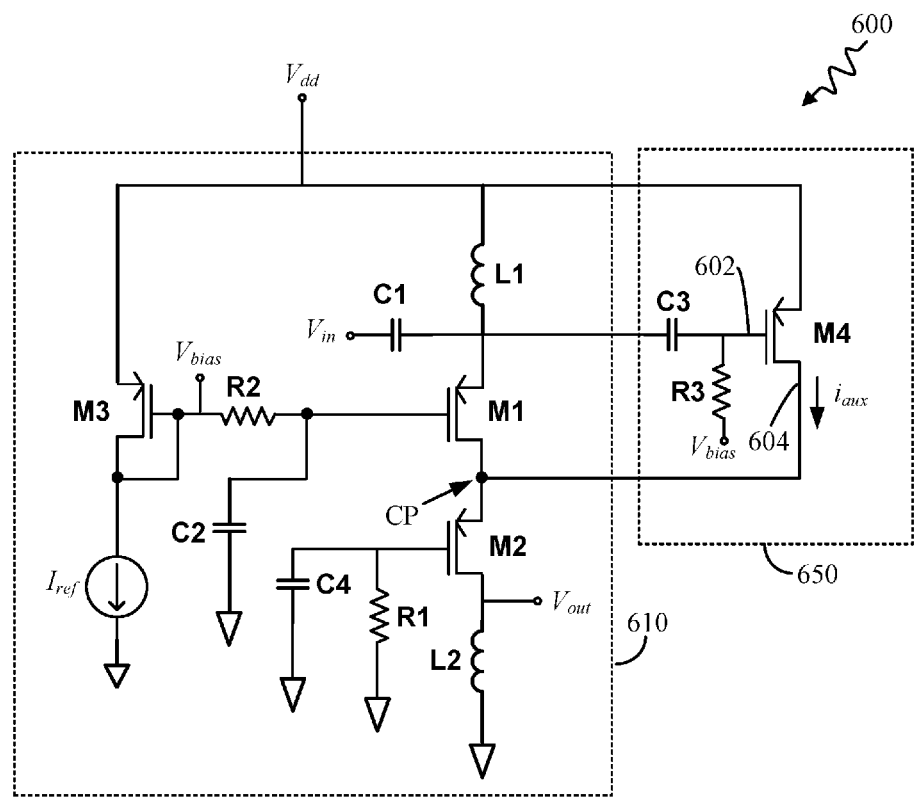
FIG. 6 illustrates a third exemplary novel RF amplifier 600 having correction circuitry.

FIG. 6 illustrates a third exemplary novel RF amplifier 600 according to one aspect of the disclosure. The RF amplifier 600 shown in FIG. 6 is a CMOS, wideband amplifier having a common gate architecture (e.g., two-stage common gate). The RF amplifier 600 includes the main amplifier 610 and the correction circuit 650. The main amplifier includes a first PMOS transistor M1 (e.g., "input transistor") having a transconductance (gm) that establishes a real 50 ohms impedance at the input node $V_{in}$ given by the equation Rin=1/gm, where Rin is the input real impedance. Passive devices C1 and L1 resonate out the effects of the amplifier's 600 package bondwire inductance as well as parasitic capacitance lumped at the input node $V_{in}$. Active devices M1 and M2 form a first and second common gate stage in the main amplifier 610 and provide isolation between the input node $V_{in}$ and the output node $V_{out}$. Passive devices R1 and C4 form an RC low-pass filter, which rejects undesired common mode, low frequency noise on the ground line. The main DC bias voltage $V_{bias}$ is generated by devices C2, R2, and M3. $I_{ref}$ is a DC bias current which will create a gate-source voltage (Vgs) across the gate of PMOS transistor M3. This voltage is mirrored across the gate-source voltage Vgs of the first transistor M1 thereby putting the PMOS transistor M1 in a saturation mode of operation and allowing the wideband main amplifier circuit 610 to amplify a given signal at the input $V_{in}$.

The correction circuit 650 is coupled to the main amplifier 610 and provides an intermodulation product cancellation signal to the main amplifier's signal path to cancel out $IM_3$ distortion products produced by the main amplifier 610. In the example illustrated in FIG. 6, the correction circuit's 650 active components includes a single PMOS transistor M4 (e.g., auxiliary transistor) that has a gate terminal 602 coupled to the input signal $V_{in}$ and a drain terminal 604 coupled to the common point CP ("common node") of the main amplifier's active devices M1 and M2. The correction circuit 650 will produce a scaled down version of the main amplifier circuit's 610 signal current. Specifically, the correction circuit's 650 signal current $N*i_{sig}$ is equal to $gm_{M4}*Vgs_{M4}$, where the transconductance $gm_{M4}=gm_{M1}*N$. The fraction N is equal to $SQRT[W_{M1}/L_{M1})/(W_{M4}/L_{M4})]$, where W and L refer to the device width and length, respectively.

Passive devices C3 and R3 provide the correction circuit's 650 DC biasing. The Vgs of M4 (i.e., $Vgs_{M4}$) is biased such that it is a scaled version of the main amplifier's first transistor M1 Vgs (i.e., $Vgs_{M1}$). The DC and signal currents of the main amplifier 610 and the correction circuit 650 are summed at the common point CP. That is, the signal $i_{Aux}$ provided by the correction circuit 650 is summed at the common point CP so that $i_{Aux}$ is subtracted from the main amplifier's signal path. It is at the common point CP where the $IM_3$ terms (e.g., $i_{NL3a}$ and $i_{NL3b}$) will cancel.

The RF amplifiers 200, 500, 600 described above with respect to FIGS. 3-6 include a two-stage common gate main amplifier 210, 510, 610 section. However, this is merely exemplary. The cancellation circuits 250, 550, 650, described above may be coupled to main amplifiers having different architecture in order to provide $IM_3$ distortion nulling for such amplifiers. Some non-limiting, non-exclusive examples of other RF amplifier architectures that the cancellation circuits 250, 550, 650 may be applied to include one or more stage common source/emitter amplifier architectures, one or more stage common drain/collector amplifier architectures, tuned CMOS or bipolar amplifier architectures, etc.

Moreover, in the exemplary cancellation circuits 210, 510, 610 described above with respect to FIGS. 3-6, the cancellation circuits 210, 510, 610 include a solitary active device M4/Q4, meaning that it is the only active device of the cancellation circuit 210, 510, 610. However, in other aspects, the cancellation circuits 210, 510, 610 may include additional active components that are not positioned along the intermodulation product cancellation signal path of the cancellation circuit 210, 510, 610.

Figure 7:
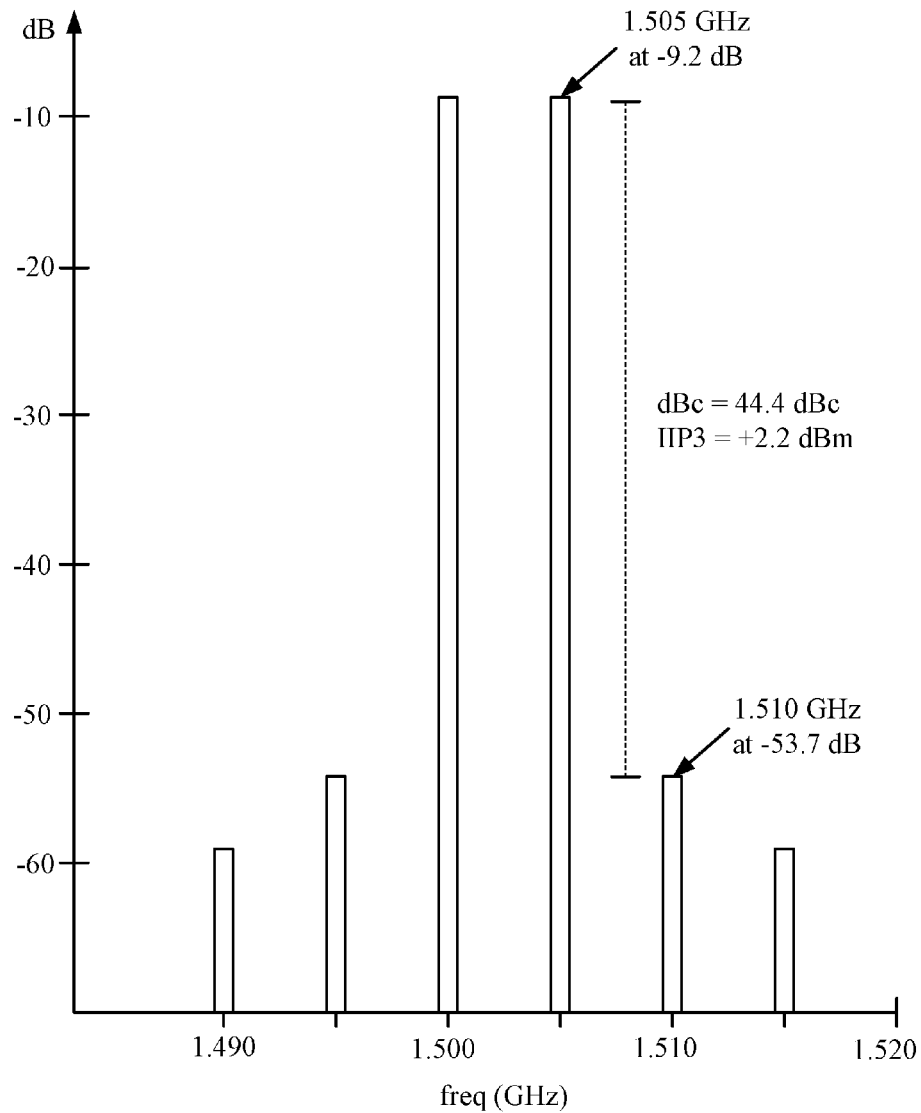
FIG. 7 illustrates a graph of a transient simulation for a two-tone input signal applied to a two-stage common gate RF amplifier without correction circuitry found in the prior art.

FIG. 7 illustrates a graph of a transient simulation for a two-tone input signal applied to a two-stage common gate RF amplifier 110 (see FIG. 1) without correction circuitry 150 found in the prior art. The main signal tones are spaced 10 MHz apart and have center frequencies of 1.500 GHz and 1.510 GHz. Each tone has a power of −20 dBm referenced to 50 ohms. The graph shows that such an RF amplifier circuit without correction has a simulated input IP3 (IIP3) of +2.2 dBm and 44.4 dBc.

Figure 8:
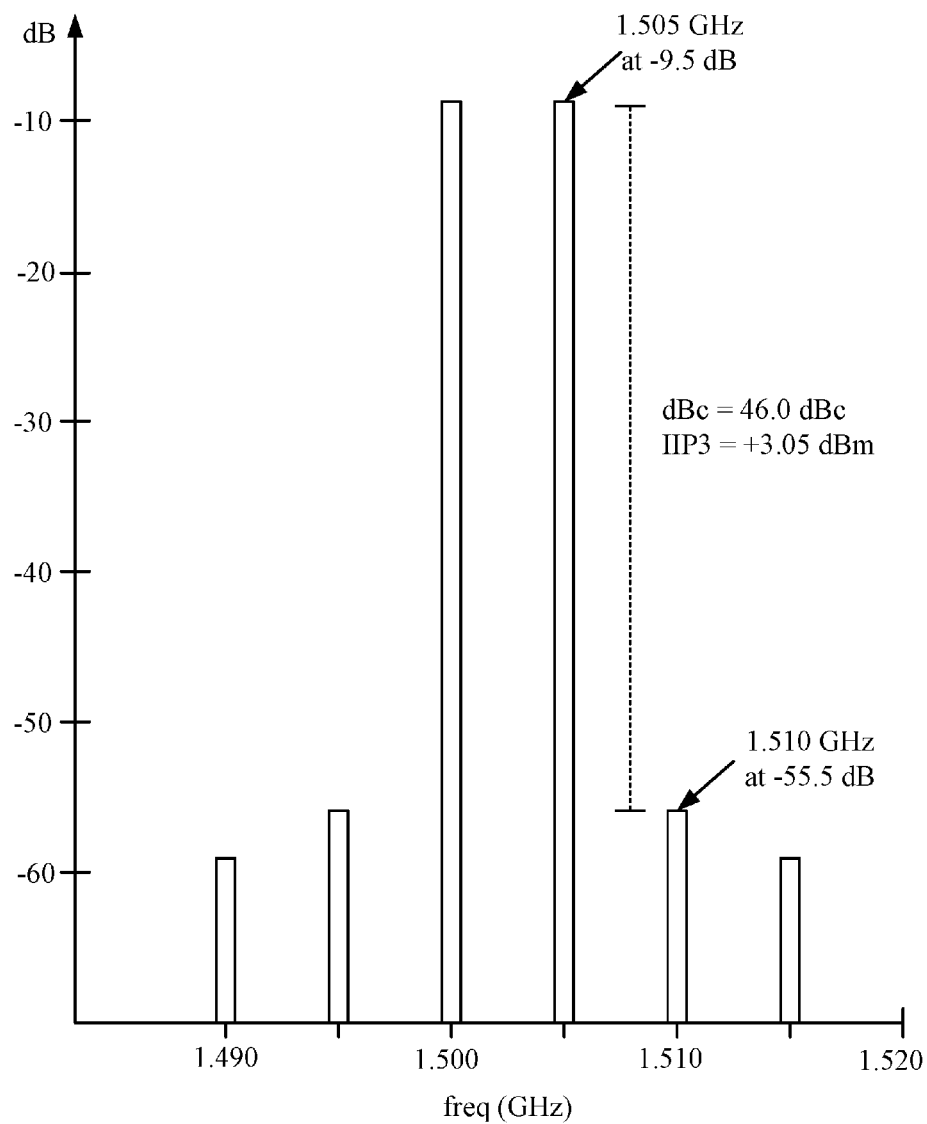
FIG. 8 illustrates a graph of a transient simulation for a two-tone input signal applied to a two-stage common gate RF amplifier with PMOS current mirror-based correction circuitry found in the prior art.

FIG. 8 illustrates a graph of a transient simulation for a two-tone input signal applied to a two-stage common gate RF amplifier 110 (see FIG. 1) with correction circuitry 150 found in the prior art. The main signal tones are spaced 10 MHz apart and have center frequencies of 1.500 GHz and 1.510 GHz. Each tone has a power of −20 dBm referenced to 50 ohms. The graph shows that such an RF amplifier circuit with PMOS mirror correction has a simulated IIP3 of +3.05 dBm and 46.0 dBc.

Figure 9:
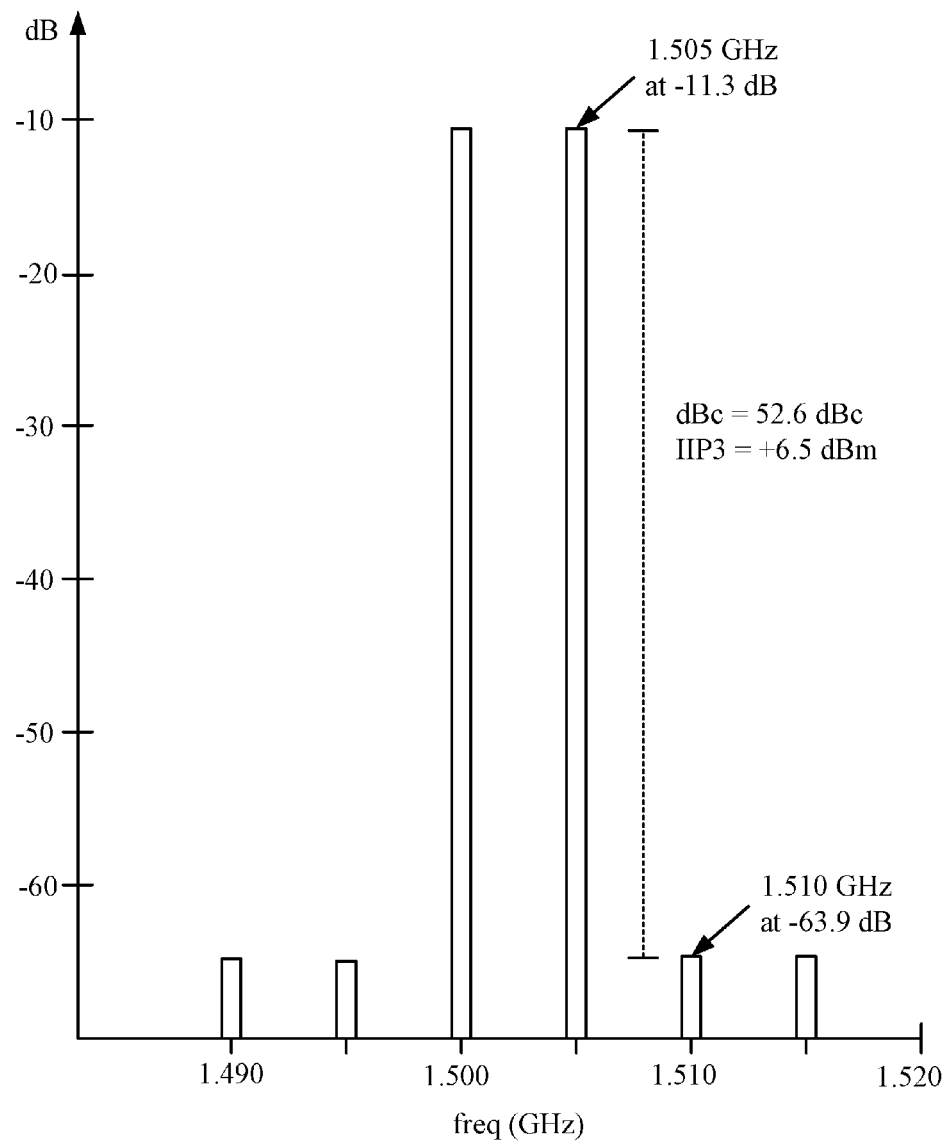
FIG. 9 illustrates a graph of a transient simulation for a two-tone input signal applied to the two-stage common gate RF amplifier shown in FIGS. 3 and 4.

FIG. 9 illustrates a graph of a transient simulation for a two-tone input signal applied to the two-stage common gate RF amplifier 200 shown in FIGS. 3 and 4. The main signal tones are spaced 10 MHz apart and have center frequencies of 1.500 GHz and 1.510 GHz. Each tone has a power of −20 dBm referenced to 50 ohms. The graph shows that the novel RF amplifier circuit 200 has a simulated IIP3 of +6.5 dBm and 52.6 dBc, which is much improved over the prior art correction circuitry 150 (see FIG. 1). Thus, the short delay NMOS correction circuitry 250 (see FIG. 4) improves IIP3 considerably by about 3.5 to 4.3 dBm over two-stage common gate amplifiers having no correction circuitry or those have PMOS mirror based correction circuitry 150. Similarly, dBc performance is also improved by at least 6.6 dBc.

FIG. 10 illustrates a table that summarizes and compares the IIP3 performance and DC power consumption of the RF amplifier simulations shown and described with respect to FIGS. 7-9. As indicated in the table, the best performance of the three is obtained by the RF amplifier featuring short delay NMOS correction circuitry (i.e., RF amplifier 200 of FIGS. 3 and 4) whose IIP3 value is greater than both the RF amplifier having no correction circuitry (i.e., RF amplifier 110 in FIG. 1) and the RF amplifier having the PMOS mirror based correction circuitry (i.e., RF amplifier 100 in FIG. 1). Its DC power consumption is also lower than the RF amplifier having the PMOS mirror based correction circuitry.

Figure 11:
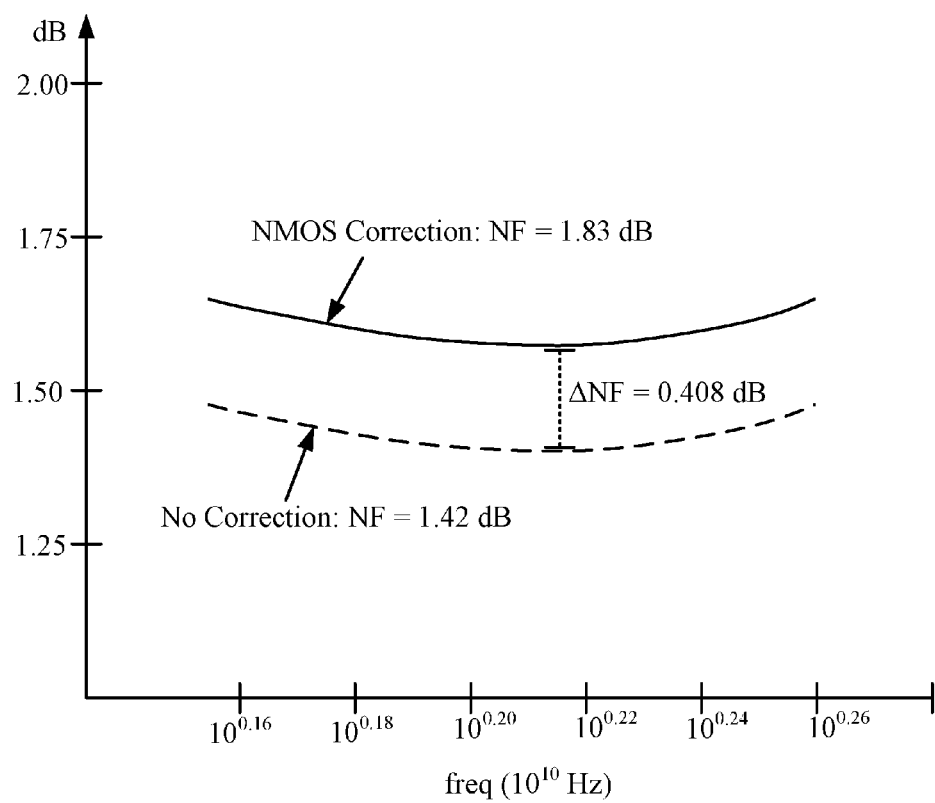
FIG. 11 illustrates a noise figure simulation comparing the noise figure of a prior art two-stage common gate amplifier with no correction circuitry to the RF amplifier having NMOS based correction circuitry shown in FIGS. 3 and 4.

FIG. 11 illustrates a noise figure simulation comparing the noise figure of a prior art two-stage common gate amplifier 110 (see FIG. 1) with no correction circuitry to the RF amplifier 200 having NMOS based correction circuitry shown in FIGS. 3 and 4. The simulation shows that the correction circuitry contributes a relatively minor noise amount of 0.408 dB. The noise contribution of is mainly due to auxiliary transistor M4 shown in FIG. 4. This significant improvement in IIP3 performance and minimal DC power consumption more than justifies the slight increase in noise contributed by the correction circuitry.

Thus, an improved RF amplifier with $IM_3$ distortion nulling has been disclosed herein that incorporates a single transistor design to minimize delay through the correction circuit. Moreover, when the single transistor is an n-channel transistor, bandwidth of the amplifier is significantly improved due to the fast mobility (μn) of re-channel devices in order to achieve wideband cancellation of $IM_3$ products created in the main wideband amplifier.

It is to be understood that the described aspect is merely illustrative of some of the many specific aspects that represent applications of the principals of the present application. Although the concept has been demonstrated in CMOS and bipolar technologies, it would be obvious to one skilled in the art to apply the concepts described here to any process technology. The implementation of the concept is not integrated circuit process dependent, and resultantly, the concept is applied equally well to any process technology.

Moreover, it to be understood that specifics in the aforementioned examples may be used anywhere in one or more aspects. The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the techniques.

What is claimed is:

1. An integrated circuit comprising:
a main amplifier circuit having a single-ended signal input and a single-ended signal output with a signal path existing there between, the main amplifier circuit including a first transistor and a second transistor arranged in a two-stage common gate or two-stage common base architecture with the single-ended signal input coupled to a source or an emitter of the first transistor, and a drain or a collector of the first transistor coupled to a source or an emitter of the second transistor at a common point; and
a correction circuit coupled to the main amplifier circuit, the correction circuit including an auxiliary transistor having a gate or a base coupled to the single-ended signal input of the main amplifier circuit and a drain or a collector coupled to the signal path at the common point to reduce intermodulation products generated by the main amplifier circuit.

2. The integrated circuit of claim 1, wherein the correction circuit includes only one active component, the one active component being the auxiliary transistor.

3. The integrated circuit of claim 1, wherein the auxiliary transistor is a solitary active device of the correction circuit that receives an input signal from the single-ended signal input and provides an intermodulation product cancellation signal to the signal path to reduce the intermodulation products generated by the main amplifier circuit.

4. The integrated circuit of claim 1, wherein the auxiliary transistor is an n-channel device.

5. The integrated circuit of claim 1, wherein the auxiliary transistor is a p-channel device.

6. The integrated circuit of claim 1, wherein the first, second, and auxiliary transistors are n-channel devices.

7. The integrated circuit of claim 1, wherein the first, second, and auxiliary transistors are p-channel metal oxide semiconductor field effect transistor (PMOS) devices.

8. The integrated circuit of claim 1, wherein the auxiliary transistor has a width and a length that is sized relative to a width and a length of the first transistor of the main amplifier circuit such that third order intermodulation products generated by the auxiliary transistor and provided to the signal path have a magnitude that is substantially same as a magnitude of third order intermodulation products generated by the main amplifier circuit.

9. The integrated circuit of claim 1, wherein an input signal gain of the correction circuit is between 15 dB to 40 dB less than a signal gain between the single-ended signal input and the single-ended signal output of the main amplifier circuit.

10. The integrated circuit of claim 1, wherein the correction circuit includes at least one biasing capacitor and a biasing resistor that provide a biasing voltage to the auxiliary transistor.

11. The integrated circuit of claim 10, wherein a capacitance value of the capacitor and a resistance value of the resistor cause the auxiliary transistor to have a gate-source voltage or a base-emitter voltage that is scaled relative to a gate-source voltage or a base-emitter voltage of the first transistor of the main amplifier circuit.

12. A radio frequency (RF) amplifier comprising:
a main amplifier circuit having a single-ended signal input and a single-ended signal output, the main amplifier circuit including a signal path between the single-ended signal input and the single-ended signal output, the main amplifier circuit including a first transistor and a second transistor arranged in a two-stage common gate or two-stage common base architecture with the single-ended signal input coupled to a source or an emitter of the first transistor and the single-ended signal output coupled to a drain or a collector of the second transistor, a drain or a collector of the first transistor coupled to a source or an emitter of the second transistor at a common point; and
a correction circuit coupled to the main amplifier circuit, the correction circuit including a solitary auxiliary transistor providing an intermodulation product cancellation signal to the signal path at the common point to reduce intermodulation products generated by the main amplifier circuit, the intermodulation product cancellation signal based on an input signal provided to the single-ended signal input.

13. The RF amplifier of claim 12, wherein the auxiliary transistor is an n-channel device.

14. The RF amplifier of claim 12, wherein the auxiliary transistor has a width and a length that is sized relative to a width and a length of the first transistor of the main amplifier circuit such that third order intermodulation products generated by the auxiliary transistor and provided to the signal path have a magnitude that is substantially same as a magnitude of third order intermodulation products generated by the main amplifier circuit.

15. The RF amplifier of claim 12, wherein an input signal gain of the correction circuit is between 15 dB to 40 dB less than a signal gain between the single-ended signal input and the single-ended signal output of the main amplifier circuit.

16. The RF amplifier of claim 12, wherein the correction circuit includes at least one biasing capacitor and a biasing resistor that provide a biasing voltage to the auxiliary transistor, and a capacitance value of the capacitor and a resistance value of the resistor cause the auxiliary transistor to have a gate-source voltage or a base-emitter voltage that is scaled relative to a gate-source voltage or a base-emitter voltage of the first transistor of the main amplifier circuit.

17. An integrated circuit comprising:
a main amplifier circuit having a single-ended signal input and a single-ended signal output with a signal path existing there between, the main amplifier circuit including a first transistor and a second transistor arranged in a two-stage common drain or a two-stage common collector architecture, the first transistor receiving the single-ended signal input and the second transistor providing the single-ended signal output, and a drain or a collector of the first transistor coupled to a source or an emitter of the second transistor at a common point; and
a correction circuit coupled to the main amplifier circuit, the correction circuit including an auxiliary transistor having a gate or a base coupled to the single-ended signal input of the main amplifier circuit and a drain or a collector coupled to the signal path at the common point to reduce intermodulation products generated by the main amplifier circuit.

18. The integrated circuit of claim 17, wherein the auxiliary transistor is an n-channel device.

19. The integrated circuit of claim 17, wherein the auxiliary transistor has a width and a length that is sized relative to a width and a length of the first transistor of the main amplifier circuit such that third order intermodulation products generated by the auxiliary transistor and provided to the signal path have a magnitude that is substantially same as a magnitude of third order intermodulation products generated by the main amplifier circuit.

20. The integrated circuit of claim 17, wherein an input signal gain of the correction circuit is between 15 dB to 40 dB less than a signal gain between the single-ended signal input and the single-ended signal output of the main amplifier circuit.

* * * * *